United States Patent
Kim et al.

(10) Patent No.: US 7,378,716 B2
(45) Date of Patent: May 27, 2008

(54) MAGNETIC TUNNELING JUNCTION CELL HAVING A FREE MAGNETIC LAYER WITH A LOW MAGNETIC MOMENT AND MAGNETIC RANDOM ACCESS MEMORY HAVING THE SAME

(75) Inventors: Tae-wan Kim, Yongin-si (KR);
Sang-jin Park, Pyeongtaek-si (KR);
In-jun Hwang, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 177 days.

(21) Appl. No.: 10/987,185

(22) Filed: Nov. 15, 2004

(65) Prior Publication Data

US 2005/0174834 A1 Aug. 11, 2005

(30) Foreign Application Priority Data

Nov. 14, 2003 (KR) ...................... 10-2003-0080573

(51) Int. Cl.
*H01L 29/82* (2006.01)
*H01L 43/00* (2006.01)

(52) U.S. Cl. ...................... 257/421; 257/422

(58) Field of Classification Search ........ 257/421–422; 365/158
See application file for complete search history.

(56) References Cited

U.S. PATENT DOCUMENTS

| | | | |
|---|---|---|---|
| 6,233,172 B1 * | 5/2001 | Chen et al. | 365/173 |
| 6,487,110 B2 * | 11/2002 | Nishimura et al. | 365/158 |
| 6,930,910 B2 * | 8/2005 | Oh et al. | 365/158 |
| 7,151,652 B2 * | 12/2006 | Nickel et al. | 360/324.11 |
| 2003/0063492 A1 | 4/2003 | Rubrig et al. | |
| 2003/0123197 A1 | 7/2003 | Mizuguchi et al. | |
| 2003/0146084 A1 * | 8/2003 | Fu | 204/192.2 |
| 2003/0184921 A1 | 10/2003 | Sugita et al. | |

FOREIGN PATENT DOCUMENTS

| | | |
|---|---|---|
| EP | 1 187 103 | 3/2002 |
| EP | 1 288 958 | 3/2003 |
| EP | 1 437 747 | 7/2004 |
| WO | WO 2004/109820 | 12/2004 |

OTHER PUBLICATIONS

Kim, et al., "Technological issues for high-density MRAM development" J. Magnetism and Magnetic Materials, vol. 282, pp. 232-236, (Nov. 2004).

Oliver, et al. "Dielectric breakdown in magnetic tunnel junctions having and ultrathin barrier", J. Applied Physics, vol. 91, No. 7, pp. 4348-4352 (Apr. 1, 2002).

(Continued)

*Primary Examiner*—Cuong Nguyen
(74) *Attorney, Agent, or Firm*—Lee & Morse, P.C.

(57) ABSTRACT

A magnetic tunneling junction (MTJ) cell includes a free magnetic layer having a low magnetic moment, and a magnetic random access memory (MRAM) includes the MTJ cell. The MTJ cell of the MRAM includes a lower electrode, a lower magnetic layer, a tunneling layer, an upper magnetic layer and an upper electrode, which are sequentially stacked on the lower electrode. The upper magnetic layer includes a free magnetic layer having a thickness of about 5 nm or less. The MTJ cell may have an aspect ratio of about 2 or less, and the free magnetic layer may have a magnetic moment of about 800 emu/cm³ or less.

20 Claims, 11 Drawing Sheets

OTHER PUBLICATIONS

Park, et al., "Magnetic tunnel junctions with low M. free layers", Phys. Stat. Sol. (a) vol. 201, No. 8, pp. 1640-1643 (Jun. 2004).

Sakakima, H., et al., "Magnetoresistance in CoMnB/Co(Fe)/Cu/Co(Fe) spin-valves", Journal of Magnetism and Magnetic Materials, vol. 165, No. 3, pp. 108-110, (1997).

* cited by examiner

MAGNETIC TUNNELING JUNCTION CELL HAVING A FREE MAGNETIC LAYER WITH A LOW MAGNETIC MOMENT AND MAGNETIC RANDOM ACCESS MEMORY HAVING THE SAME

BACKGROUND OF THE INVENTION

1. Field of the Invention

The present invention relates to a semiconductor memory. More particularly, the present invention relates to a magnetic tunneling junction (MTJ) cell having a free magnetic layer with a low magnetic moment and a magnetic random access memory (MRAM) having the same.

2. Description of the Related Art

A magnetic random access memory (MRAM) consists of a transistor and a magnetic tunneling junction (MTJ) cell in which data is stored. A magnetoresistance (MR) ratio of an MTJ cell changes depending on magnetic polarization orientations of vertically stacked magnetic layers. The MRAM is a memory device that writes data using the characteristics of the MTJ cell.

In order to accurately read out data from an MRAM, it is preferable that the MRAM has as large a sensing margin as possible. The sensing margin is generally determined by the MR ratio of the MTJ cell.

In order to increase the MR ratio of the MTJ cell, stability and uniformity of the MTJ cell must be assured. For this purpose, a tunneling oxide layer of the MTJ cell must have a uniform thickness and stability of manufacturing processes must first be established.

In addition, the MRAM must assure selectivity, i.e., other MTJ cells adjacent to a selected MTJ cell must not be influenced during an operation of selecting the selected MTJ cell. In a well-known MRAM (hereinafter, referred to as "the conventional MRAM"), however, abnormal phenomena, such as an edge pinning and a vortex pinning, have been reported during writing or reading data to or from an MTJ cell.

Due to these phenomena, larger switching fields are demanded during the data read/write operation. This results in failed bits, i.e., MTJ cells which are not switched by a normal switching field during the data read/write operation.

FIG. 1 illustrates an edge pinning that occurs in a free magnetic layer during the data read/write operation of the conventional MTJ cell, and FIG. 2 illustrates a variation in hysteresis characteristics arising from the edge pinning.

FIG. 3 illustrates a vortex pinning that occurs in a free magnetic layer during the data read/write operation of the conventional MTJ cell, and FIG. 4 illustrates a variation in hysteresis characteristics arising from the vortex pinning.

In FIGS. 2 and 4, a reference symbol "■" indicates a hysteresis characteristic when a magnetic field is applied, and a reference symbol "○" indicates a hysteresis characteristic when no magnetic field is applied.

FIG. 5 illustrates a switching distribution of MTJ cells during the data write operation of the conventional MRAM, in which free magnetic layer is formed of CoFe/NiFe, here, a cobalt iron (CoFe) layer having a thickness of 10 Å and a nickel iron (NiFe) layer having a thickness of 30 Å. In FIG. 5, reference symbols C1, C2, C3 and C4 indicate ratios of failed bits, i.e., MTJ cells that are not switched in a normal switching field.

Referring to FIG. 5, the MTJ cells that are not switched in the normal switching field are switched in a switching field that is well above the normal switching field (C1, C2, C4), or are switched in a switching field that is well below the normal switching field (C3).

In the conventional MRAM, the degree of integration can be increased by forming a thinner magnetic layer of the MTJ cell, especially a free magnetic layer (CoFe/NiFe). As the free magnetic layer is thinner, however, thermal stability in the magnetic moment of the free magnetic layer may be degraded. This means that the MTJ cell is thermally unstable.

SUMMARY OF THE INVENTION

The present invention is therefore directed to an MTJ cell, and an MRAM having the same, which substantially overcome one or more of the problems due to the limitations and disadvantages of the related art.

It is a feature of an embodiment of the present invention to provide an MTJ cell of an MRAM that includes a thin free magnetic layer in order to increase the degree of integration.

It is another feature of an embodiment of the present invention to provide an MTJ cell free from kinks, which are caused by edge pinning or vortex pinning.

It is yet another feature of an embodiment of the present invention to provide an MTJ cell that is thermally stable.

It is still another feature of an embodiment of the present invention to provide an MTJ cell having a reduced magnetic moment, thereby reducing the switching field strength.

Also, the present invention provides an MRAM including the MTJ cell having at least one of the above and other features.

At least one of the above and other features and advantages of the present invention may be realized by providing a magnetic tunneling junction (MTJ) cell including a lower electrode, and a lower magnetic layer, a tunneling layer, an upper magnetic layer and an upper electrode, which are sequentially stacked on the lower electrode, wherein the upper magnetic layer includes a free magnetic layer having a thickness of about 5 nm or less.

The free magnetic layer may be a magnetic layer having a magnetic moment of about 800 emu/cm$^3$ or less, or may be a stacked layer of a CoFe layer and a NiFe layer. The MTJ cell may have an aspect ratio of about 2 or less.

The free magnetic layer may be one of an amorphous rare-earth transition metal compound layer having a magnetic moment of less than about 400 emu/cm$^3$, an amorphous transition metal compound layer having a magnetic moment of less than about 600 emu/cm$^3$, and an iron terbium (FeTb) layer.

The free magnetic layer may further include a filtering layer that is formed between the magnetic layer and the tunneling layer, in which the filtering layer has a magnetic moment greater than the magnetic layer.

The lower magnetic layer may include a stacked layer of a pinning layer and an SAF (synthetic anti-ferromagnetic) layer.

At least one of the above and other features and advantages of the present invention may be realized by providing a magnetic random access memory (MRAM) including a transistor, an MTJ cell connected to the transistor, an interlayer insulating layer surrounded by the transistor and the MTJ cell, and data line which is used to write data to the MTJ cell, wherein the MTJ cell has an aspect ratio of about 2 or less.

The MTJ cell may include a free magnetic layer having a thickness of about 5 nm or less.

The free magnetic layer may have characteristics equal to the above description with relation to the MTJ cell.

An embodiment of the present invention can prevent abnormal switching phenomena, such as edge pinning and vortex pinning, from occurring in the MTJ cell. Also, an embodiment of the present invention can reduce intensity of a switching field.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF THE INVENTION

Figure 1:
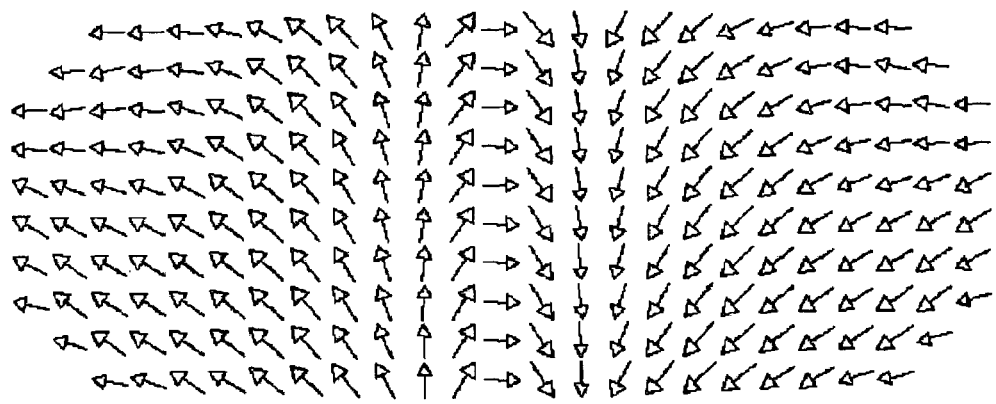
FIG. 1 illustrates an edge pinning that occurs in a free magnetic layer of an MTJ cell during a data write operation of a conventional MRAM.
Figure 2:
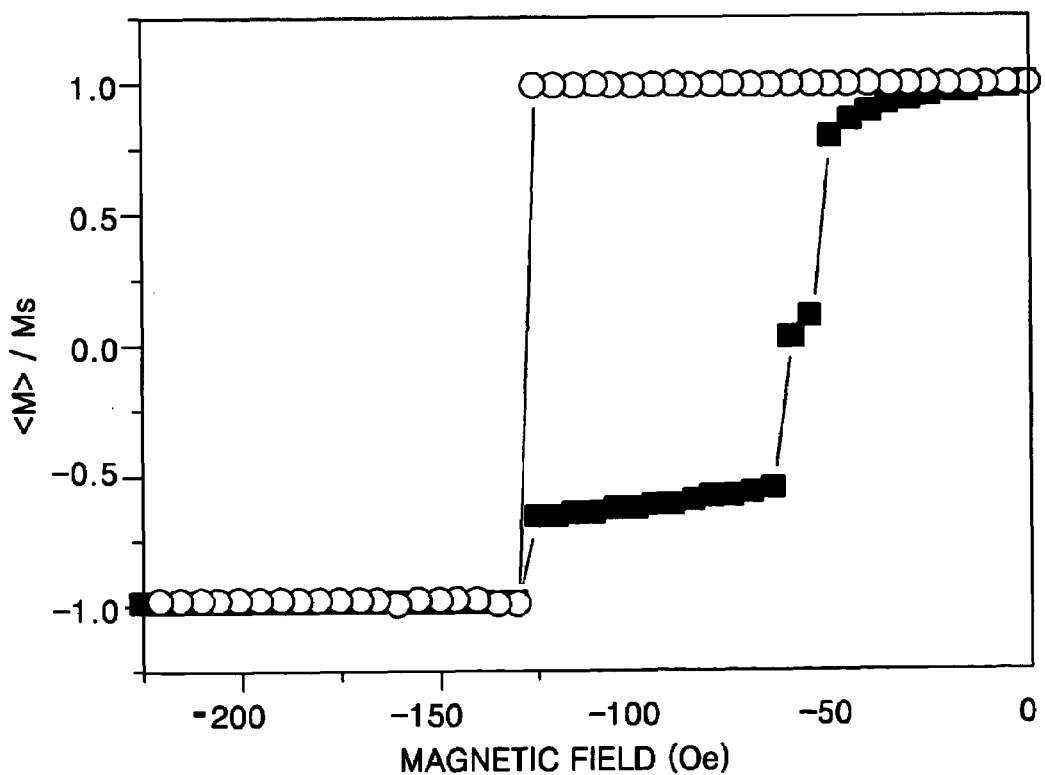
FIG. 2 illustrates a variation of hysteresis characteristic of the MTJ cell having the edge pinning shown in FIG. 1.
Figure 3:
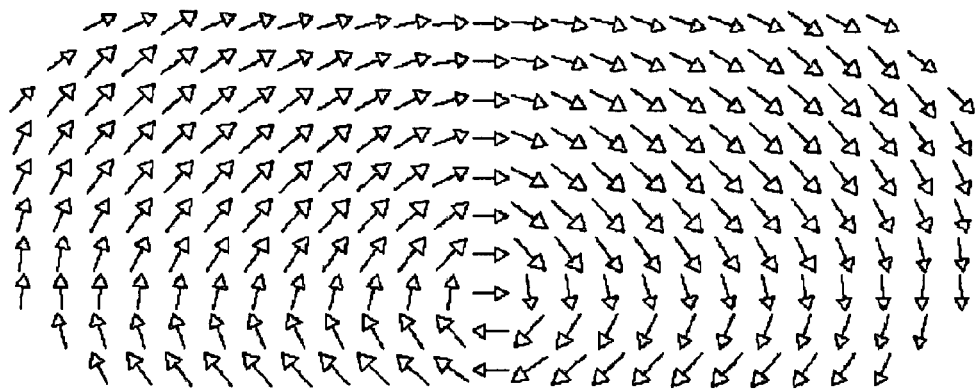
FIG. 3 illustrates a vortex pinning that occurs in a free magnetic layer of an MTJ cell during a data write operation of the conventional MRAM.
Figure 4:
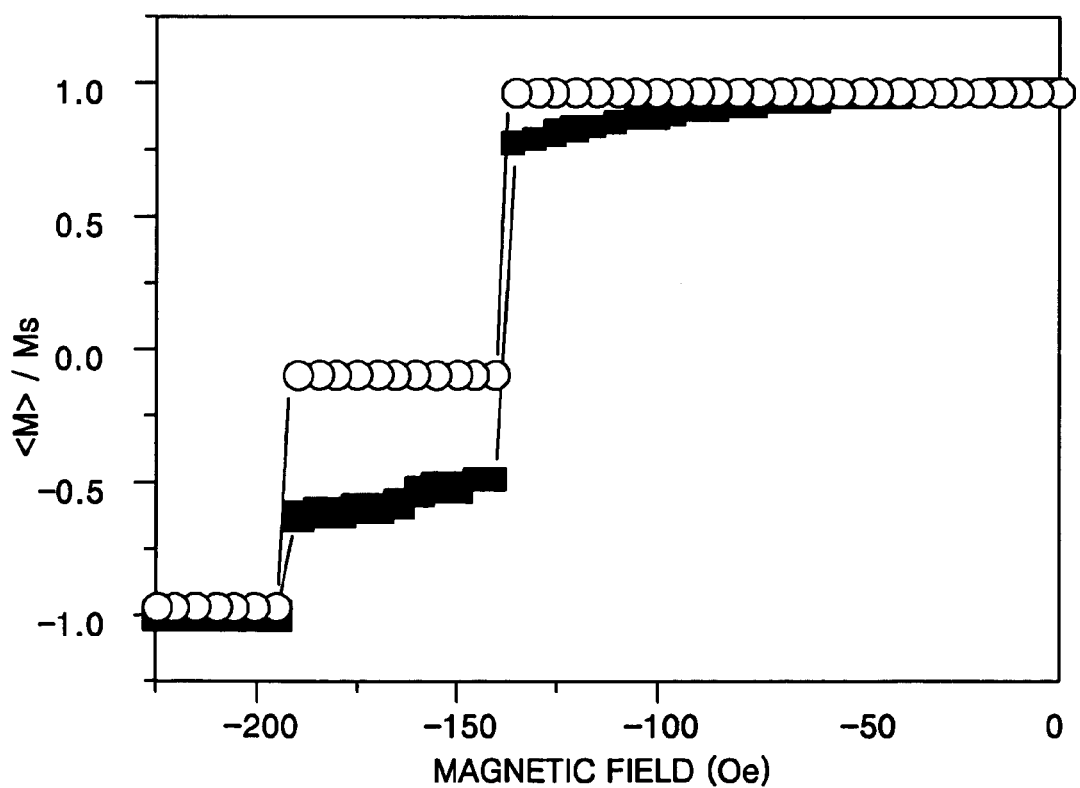
FIG. 4 illustrates a variation of hysteresis characteristic of the MTJ cell having the vortex pinning shown in FIG. 3.

Korean Patent Application No. 2003-80573, filed on Nov. 14, 2003, in the Korean Intellectual Property Office, and entitled: "Magnetic Tunneling Junction Cell Having a Free Magnetic Layer with a Low Magnetic Moment and Magnetic Random Access Memory Having the Same," is incorporated by reference herein in its entirety.

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals in the drawings denote like elements, and thus their description will be omitted.

Figure 6:
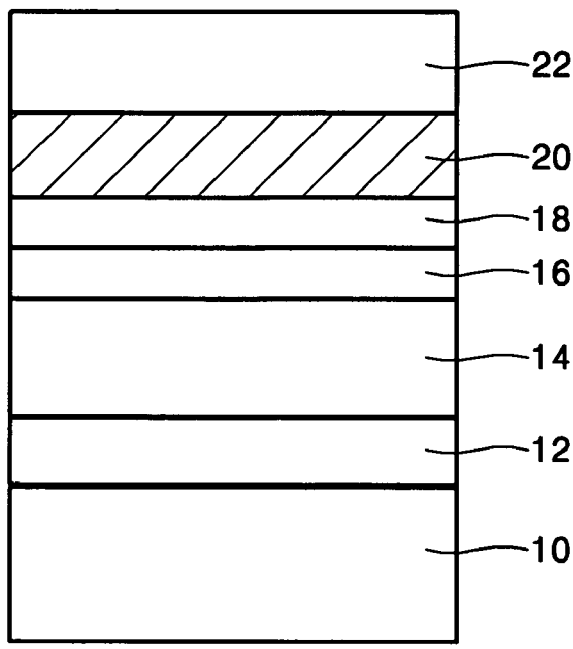
FIG. 6 illustrates a sectional view of an MTJ cell of an MRAM according to a first embodiment of the present invention.
Figure 7:
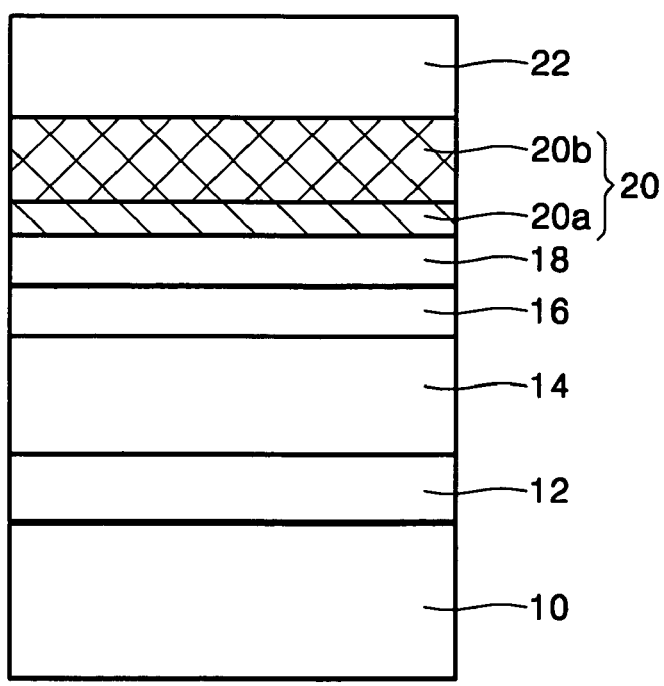
FIG. 7 illustrates a sectional view of an MTJ cell of an MRAM according to a second embodiment of the present invention, where the free magnetic layer of the MTJ cell of FIG. 6 is formed with two magnetic layers.
Figure 8:
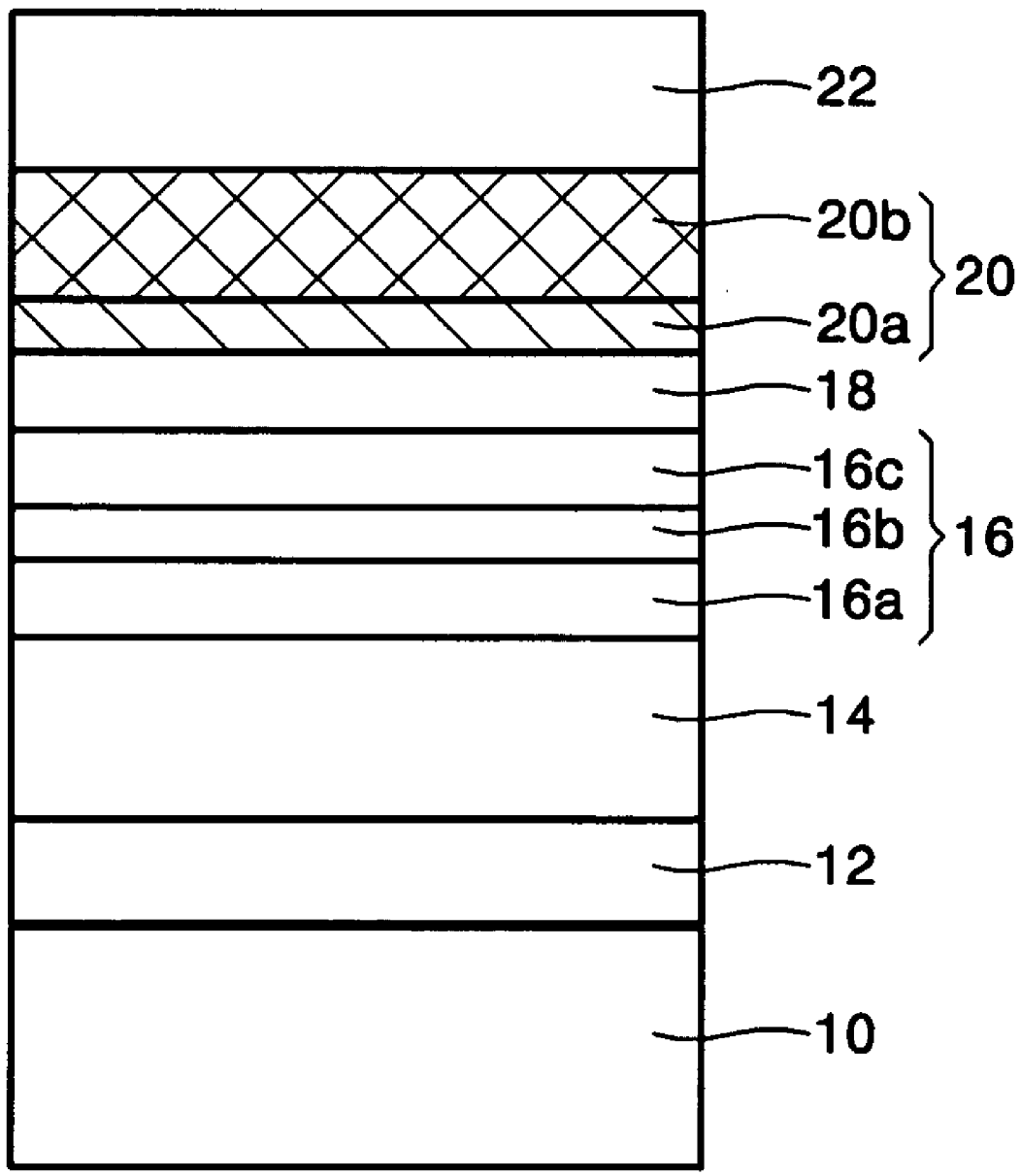
FIG. 8 illustrates a sectional view of an MTJ cell of an MRAM according to a third embodiment of the present invention, where the pinned layer of the MTJ cell of FIG. 7 is a synthetic anti-ferromagnetic (SAF) layer.

FIG. 6 illustrates a sectional view of an MTJ cell of an MRAM according to a first embodiment of the present invention. FIG. 7 illustrates a sectional view of an MTJ cell of an MRAM according to a second embodiment of the present invention. FIG. 8 illustrates a sectional view of an MTJ cell of an MRAM according to a third embodiment of the present invention.

Referring to FIG. 6, the MTJ cell according to the first embodiment of the present invention includes a pad conductive layer 10 (hereinafter, referred to as "the lower electrode") that is connected to a switching element, for example, a transistor. The lower electrode 10 may be a tantalum (Ta) electrode or a titanium nitride (TiN) electrode. Also, the MTJ cell according to the first embodiment of the present invention includes a seed layer 12, a pinning layer 14, a pinned layer 16, a tunnelling layer 18, a free magnetic layer 20, and a capping layer 22, which are sequentially stacked on the lower electrode 10. An upper electrode (not shown) is stacked on the capping layer 22. The seed layer 12 may be an amorphous metal layer, a ruthenium (Ru) layer, or a nickel iron (NiFe) layer. The pinning layer 14 may be an anti-ferromagnetic layer, for example, an iridium magnesium (IrMn) layer or a platinum magnesium (PtMn) layer. The pinned layer 16 may be a single layer or a plurality of material layers.

The tunnelling layer 18 may be an oxide layer having a predetermined thickness, for example, an aluminium oxide $(AlO_x)$ layer of about 15 Å. The free magnetic layer 20 may be a material layer having a predetermined magnetic moment in a predetermined thickness, for example, an amorphous material layer having a thickness of about 5 nm or less and a magnetic moment of about 800 emu/cm$^3$ or less. The amorphous material layer having the magnetic moment of about 800 emu/cm$^3$ or less can be divided into a first amorphous compound layer and a second amorphous compound layer. The first amorphous compound layer may be an amorphous rare-earth transition metal compound layer having a magnetic moment of less than about 400 emu/cm$^3$, but the first amorphous compound layer may also be other materials. The second amorphous compound layer may be an amorphous transition metal compound layer having a magnetic moment of less than about 600 emu/cm$^3$, but the second amorphous compound layer may also be other materials. For example, the amorphous rare-earth transition metal compound layer may be a cobalt terbium (CoTb) layer and the amorphous transition metal compound layer may be a cobalt zirconium compound (CoZrX). Here, "X" may be terbium (Tb) or niobium (Nb).

In addition to the amorphous compound layer, an iron terbium (FeTb) layer may be used as the free magnetic layer 20. Also, a material layer satisyfing the above-described thickness including a cobalt iron (CoFe) layer and a nickel iron (NiFe) layer may be used. When the material layer includes the CoFe layer and the NiFe layer, the free magnetic layer 20 may be a stacked layer of about 3 Å thick CoFe layer and about 30 Å thick NiFe layer, or a stacked layer of about 5 Å thick CoFe layer and about 30 Å thick NiFe layer.

The capping layer 22 that is stacked on the free magnetic layer 20 protects the free magnetic layer 20 during an etching process. The capping layer 22 may be a ruthenium (Ru) layer.

Although the free magnetic layer 20 may be a single layer, using a double layer as the free magnetic layer 20, as shown in FIGS. 7 and 8, helps increase of magnetoresistance (MR) ratio.

Referring to FIG. 7, according to the second embodiment of the present invention, the free magnetic layer 20 includes first and second magnetic layers 20a and 20b, which are stacked sequentially. The first magnetic layer 20a is a filtering layer that increases MR ratio of the free magnetic layer 20. The first magnetic layer 20a may be a ferromagnetic layer having large polarizability, e.g., a CoFe layer. The second magnetic layer 20b may be an amorphous material layer having a magnetic moment of about 800 emu/cm$^3$ or less. Even when the free magnetic layer 20 is formed with the first and second magnetic layers 20a and 20b, a total thickness of the free magnetic layer 20 may still be about 5 nm or less.

Referring to FIG. 8, according to the third embodiment of the present invention, the pinned layer 16 may be a plurality of material layers. The pinned layer 16 may be a synthetic anti-ferromagnetic (SAF) layer shown in FIG. 8, which is formed by stacking a first pinned layer 16a, an intermediate layer 16b and a second pinned layer 16c in sequence. The first pinned layer 16a may be an anti-ferromagnetic layer, e.g., a CoFe layer. The intermediate layer 16b may be a metal layer, e.g., a Ru layer. The second pinned layer 16c may be an anti-ferromagnetic layer, e.g., a CoFe layer.

A characteristic of the MTJ cell according to the various embodiments of the present invention will now be described.

Figure 9:
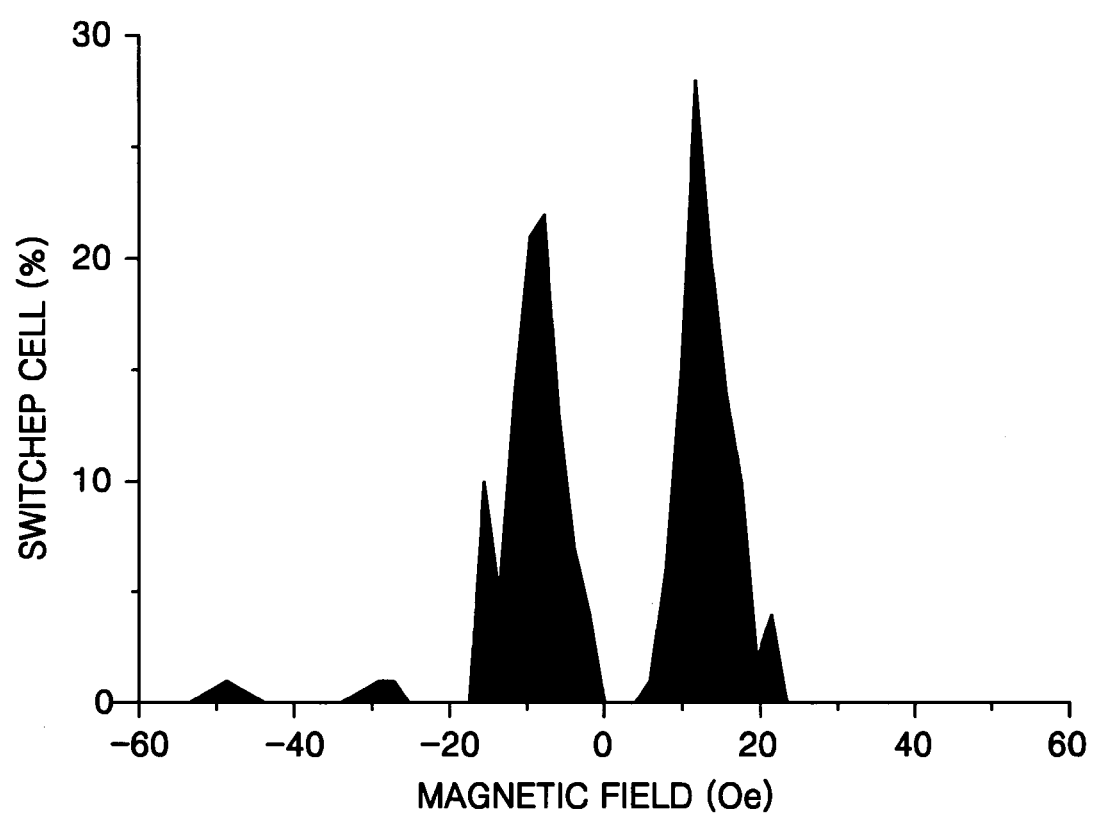
FIG. 9 illustrates a switching distribution of MTJ cells during data write operation of the MRAM according to the present invention.

FIG. 9 illustrates an occurrence of failed bits in an array of the MTJ cells according to the present invention, in which the MTJ cells include the free magnetic layer formed with 5 Å thick CoFe layer and 30 Å thick NiFe layer.

Figure 5:
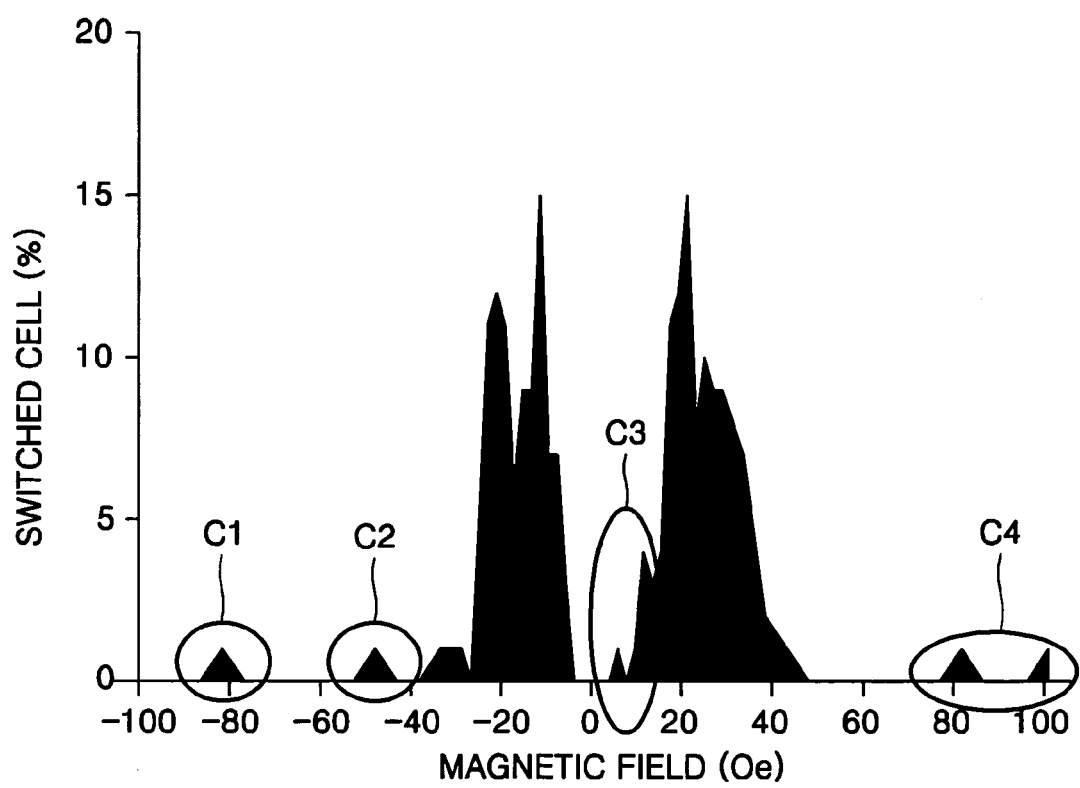
FIG. 5 illustrates a switching distribution of MTJ cells during a data write operation of the conventional MRAM.

Comparing FIGS. 5 and 9, it can be seen that the occurrence of failed bits is much less in the array consisting of the MTJ cells according to the present invention. This means that most of the MTJ cells according to the present invention are switched normally.

Figure 10:
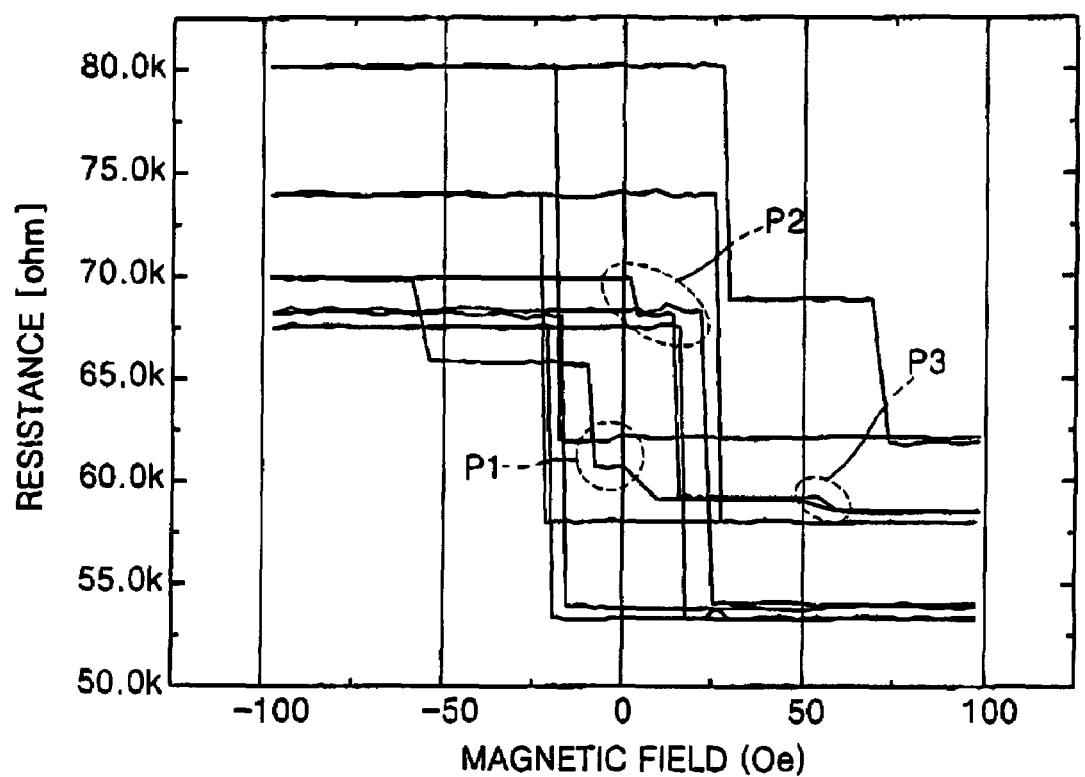
FIG. 10 illustrates magnetic field strength versus resistance (H-R) characteristics of the conventional MTJ cells.
Figure 11:
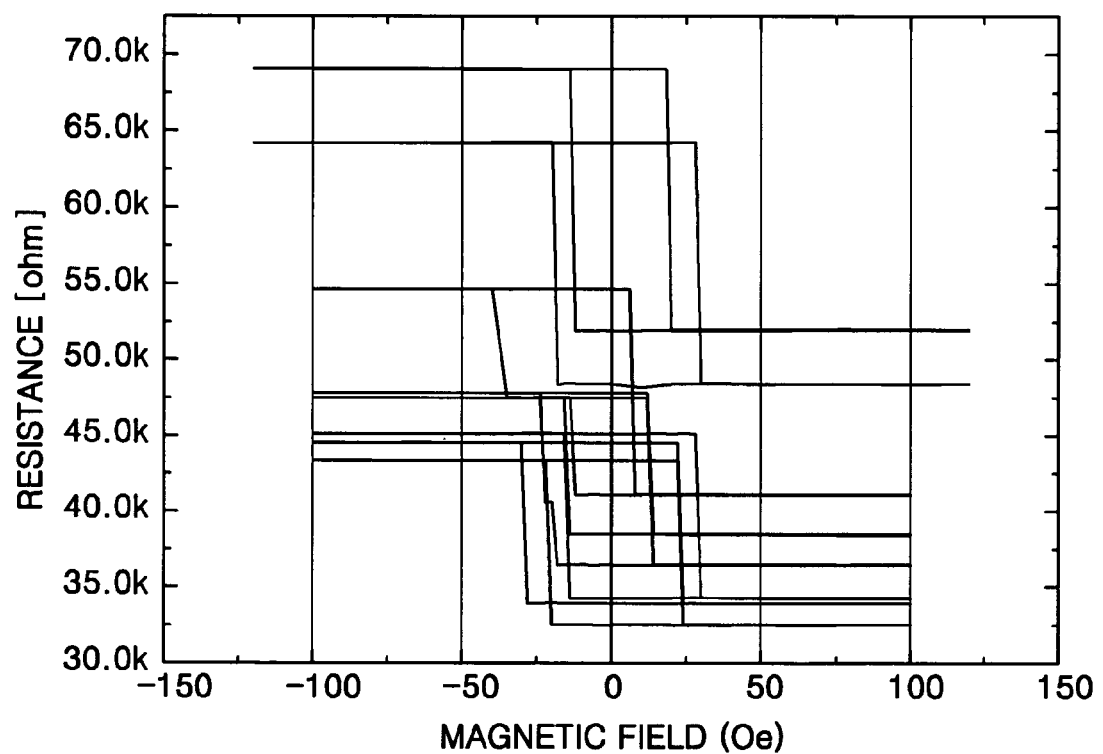
FIG. 11 illustrates H-R characteristics of the MTJ cells according to the present invention.

FIGS. 10 and 11 illustrate magnetic field strength versus resistance (H-R) characteristic curves of the MTJ cells according to the prior art and the present invention, respectively. In FIG. 10, reference symbols P1 and P2 indicate distorted portions of the H-R characteristic curve, which are caused by a vortex pinning, and a reference symbol P3 is a distorted portion of the H-R characteristic curve, which is caused by an edge pinning.

Comparing FIGS. 10 and 11, it can be seen that the distorted portions P1, P2 and P3 of FIG. 10 do not appear in FIG. 11. These results show that the MTJ cells according to the present invention are free from kinks caused by the edge pinning or the vortex pinning.

Figure 12:
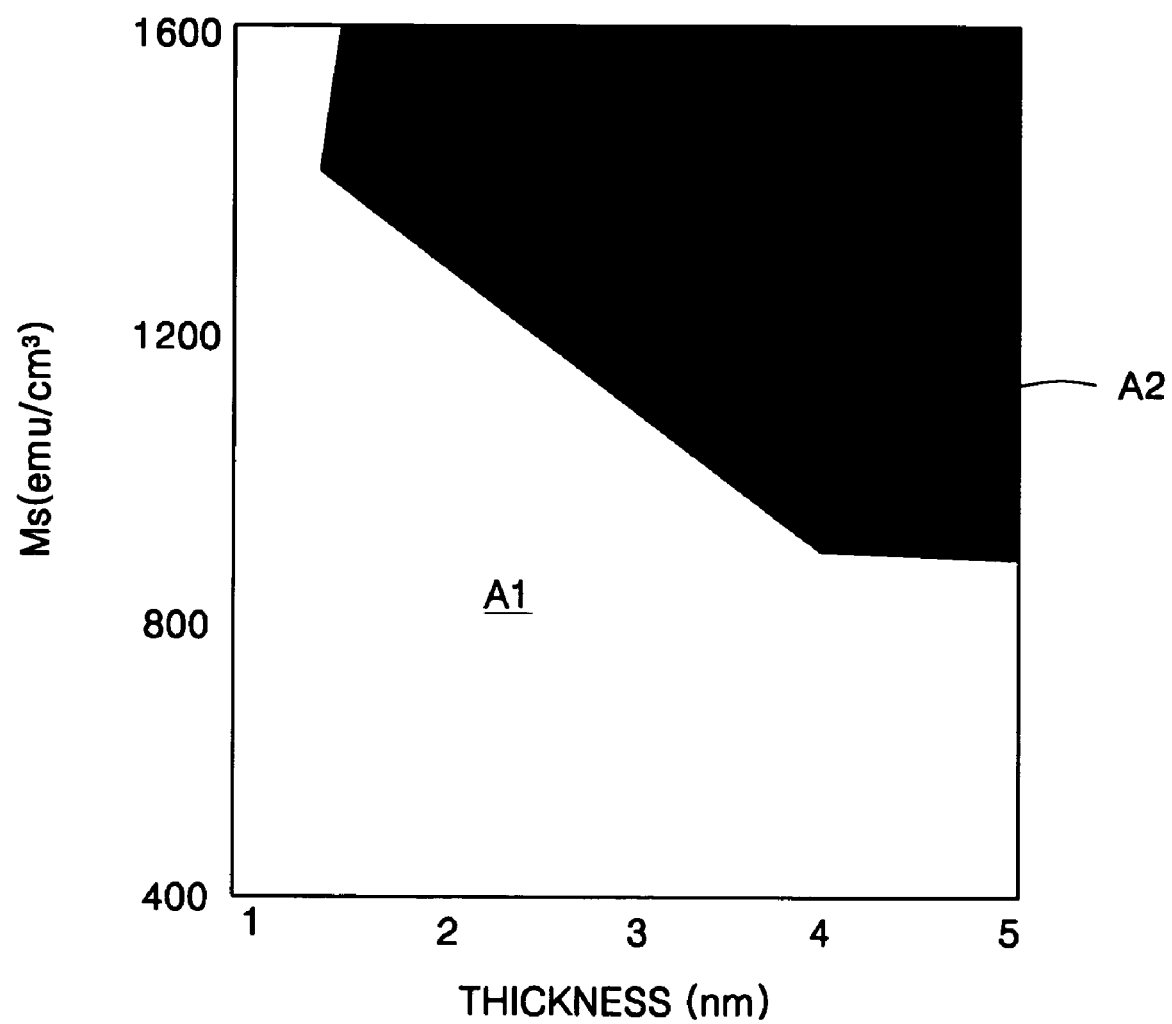
FIGS. 12 through 14 illustrate, for respective different aspect ratios of the MTJ cells, values for magnetic moments and thicknesses of the free magnetic layer that can make the MTJ cell free from kinks.
Figure 13:
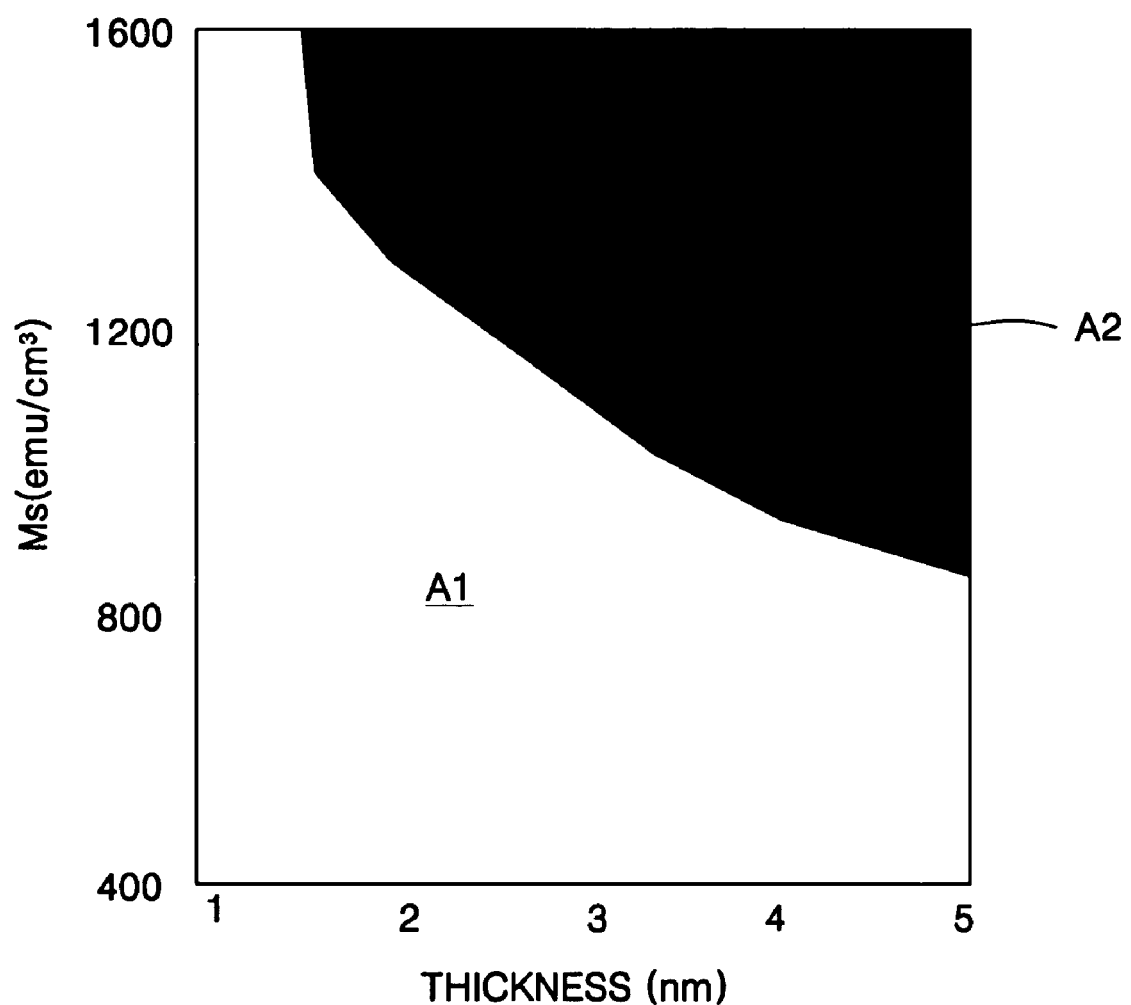
Figure 14:
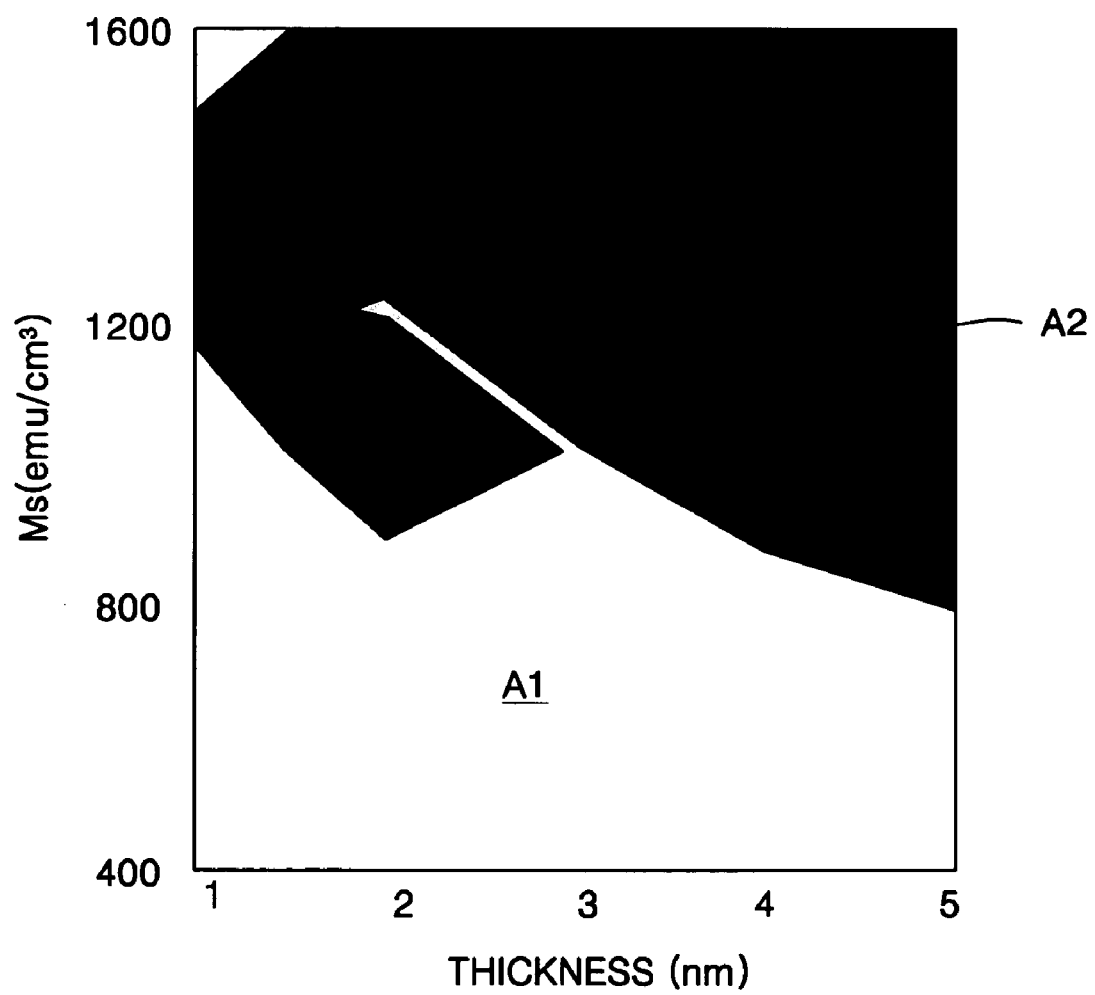

FIGS. 12 through 14 illustrate a correlation of aspect ratio (AR) of the MTJ cell, thickness and magnetic moment of the free magnetic layer, and kinks of the MTJ cell. In FIGS. 12 through 14, a reference symbol A1 indicates an area having no kinks and a reference symbol A2 indicates an area having kinks.

Referring to FIG. 12, when the AR of the MTJ cell is "1", the MTJ cell has no kinks if the free magnetic layer has a thickness about 5 nm and a magnetic moment (Ms) of about 800 emu/cm$^3$. Further, as the free magnetic layer is made thinner, e.g., 3 nm or less, the MTJ cell can be free of kinks even when the free magnetic layer has a magnetic moment (Ms) of about 1000 emu/cm$^3$ or more.

Referring to FIG. 13, when an AR of the MTJ cell is "1.5", the tendency described above in connection with FIG. 12 is also equally applicable.

FIG. 14 illustrates a condition that makes the MTJ cell free from kinks when an AR of the MTJ cell is "2". Referring to FIG. 14, it can be seen that the MTJ cell still has kinks when the free magnetic layer has a thickness of more than 5 nm, even with lower magnetic moments.

From the results of FIGS. 12 through 14, in order for the MTJ cells of FIGS. 6 through 8 to be free from kinks, it is preferable that the free magnetic layer 20 is formed of a material layer having the above-described thicknesses and magnetic moments. Also, it is preferable that the AR of the MTJ cell is about 2 or less.

Meanwhile, the MRAM according to the present invention may include a typical transistor (for example, a field effect transistor (FET)) formed on a substrate, the MTJ cell of FIG. 6, 7 or 8 connected to the transistor, and an interlayer insulating layer surrounded by them. Also, the MRAM according to the present invention may include a data line that is used to write data to the MTJ cell. Since the MTJ cell is described above and the other elements are well known, a configuration of the MRAM according to the present invention will be omitted.

As described above, the MTJ cell of the MRAM according to the present invention may have AR of about 2 or less. Also, the MTJ cell may include the free magnetic layer that is formed of the amorphous compound layer having a thickness of about 5 nm or less and a magnetic moment of about 800 emu/cm$^3$ or less. Accordingly, when the MTJ cell of the MRAM according to the present invention is used, the degree of integration can be increased by forming the thinner free magnetic layer. In addition, thermal stability can be assured, and the MTJ cell can be free from kinks. Further, since the free magnetic layer has a small magnetic moment, strength of the switching field can be reduced.

Exemplary embodiments of the present invention have been disclosed herein, and although specific terms are employed, they are used and are to be interpreted in a generic and descriptive sense only and not for purpose of limitation. For example, the free magnetic layer can be formed of other material layer if satisfying the conditions of the thickness and magnetic moment. Further, the free magnetic layer can be formed of more than two, e.g., three, layers. Accordingly, it will be understood by those of ordinary skill in the art that various changes in form and details may be made without departing from the spirit and scope of the present invention as set forth in the following claims.

What is claimed is:

1. A magnetic tunneling junction (MTJ) cell, comprising:
   a lower electrode; and
   a lower magnetic layer, a tunneling layer, an upper magnetic layer and an upper electrode, which are sequentially stacked on the lower electrode,
   wherein the upper magnetic layer includes an amorphous free magnetic layer having a thickness of about 5 nm or less and a magnetic moment of about 800 emu/cm$^3$ or less.

2. The MTJ cell as claimed in claim 1, wherein the MTJ cell has an aspect ratio of about 2 or less.

3. The MTJ cell as claimed in claim 1, wherein the amorphous free magnetic layer includes at least one of an amorphous rare-earth transition metal compound layer having a magnetic moment of less than about 400 emu/cm$^3$, an amorphous transition metal compound layer having a magnetic moment of less than about 600 emu/cm$^3$, and an iron terbium (FeTb) layer.

4. The MTJ cell as claimed in claim 1, wherein the amorphous free magnetic layer comprises a cobalt iron (CoFe) layer and a nickel iron (NiFe) layer, which are sequentially stacked.

5. The MTJ cell as claimed in claim 1, wherein the upper magnetic layer further includes a filtering layer formed between the free magnetic layer and the tunneling layer, the filtering layer having a magnetic moment greater than the magnetic moment of the amorphous free magnetic layer.

6. The MTJ cell as claimed in claim 5, wherein the filtering layer is a CoFe layer.

7. The MTJ cell as claimed in claim 1, wherein the lower magnetic layer includes a stacked layer of a pinning layer and a synthetic anti-ferromagnetic (SAF) layer.

8. The MTJ cell as claimed in claim 3, wherein the amorphous free magnetic layer includes an amorphous rare-earth transition metal compound layer having a magnetic moment of less than about 400 emu/cm$^3$, the amorphous rare-earth transition metal being cobalt terbium (CoTb).

9. The MTJ cell as claimed in claim 3, wherein the amorphous free magnetic layer includes an amorphous transition metal compound layer having a magnetic moment of less than about 600 emu/cm$^3$, the amorphous transition metal compound being at least one of cobalt zirconium terbium (CoZrTb) and/or cobalt zirconium niobium (CoZrNb).

10. A magnetic random access memory (MRAM), comprising:
    a transistor;
    a magnetic tunneling junction (MTJ) cell connected to the transistor, the MTJ cell including an amorphous free magnetic layer having a magnetic moment of about 800 emu/cm$^3$ or less; and
    an interlayer insulating layer surrounding the transistor and the MTJ cell,
    wherein the MTJ cell has an aspect ratio of about 2 or less.

11. The MRAM as claimed in claim 10, wherein the amorphous free magnetic layer has a thickness of about 5 nm or less.

12. The MRAM as claimed in claim 11, wherein the amorphous free magnetic layer includes at least one of an amorphous rare-earth transition metal compound layer having a magnetic moment of less than about 400 emu/cm$^3$, an amorphous transition metal compound layer having a magnetic moment of less than about 600 emu/cm$^3$, and an iron terbium (FeTb) layer.

13. The MRAM as claimed in claim 11, wherein the amorphous free magnetic layer is a stacked layer of a cobalt iron (CoFe) layer and a nickel iron (NiFe) layer.

14. The MRAM as claimed in claim 11, wherein the MTJ cell further comprises a filtering layer having a magnetic moment greater than that of the amorphous free magnetic layer.

15. The MRAM as claimed in claim 14, wherein the filtering layer is a cobalt iron (CoFe) layer.

16. The MTJ cell as claimed in claim 10, wherein the lower magnetic layer includes a stacked layer of a pinning layer and a synthetic anti-ferromagnetic (SAF) layer.

17. The MRAM as claimed in claim 12, wherein the amorphous free magnetic layer comprises at least one of a cobalt terbium, a cobalt zirconium terbium, and/or a cobalt zirconium niobium.

18. A magnetic tunneling junction (MTJ) cell, comprising:
    a lower electrode;
    a lower magnetic layer;
    a tunneling layer;
    an upper magnetic layer, the upper magnetic layer including an amorphous rare-earth transition metal compound layer having a magnetic moment of less than about 400 emu/cm$^3$ and an amorphous transition metal compound layer having a magnetic moment of less than about 600 emu/cm$^3$.

19. The MTJ cell as claimed in claim 18, wherein the upper magnetic layer comprises at least one of a cobalt terbium, a cobalt zirconium terbium, and/or a cobalt zirconium niobium.

20. The MTJ cell as claimed in claim 18, wherein the upper magnetic layer has a total thickness of about 5 nm or less and a magnetic moment of about 800 emu/cm$^3$.

* * * * *